(12) United States Patent
Lin et al.

(10) Patent No.: US 7,589,385 B2
(45) Date of Patent: Sep. 15, 2009

(54) SEMICONDUCTOR CMOS TRANSISTORS AND METHOD OF MANUFACTURING THE SAME

(75) Inventors: Chien-Ting Lin, Hsin-Chu (TW); Liang-Wei Chen, I-Lan Hsien (TW); Che-Hua Hsu, Hsin-Chu Hsien (TW); Meng-Lin Lee, Chang-Hua Hsien (TW); Hui-Chen Chang, Tao-Yuan Hsien (TW); Wei-Tsun Shiau, Kao-Hsiung Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 787 days.

(21) Appl. No.: 11/161,170

(22) Filed: Jul. 26, 2005

(65) Prior Publication Data

US 2007/0024321 A1   Feb. 1, 2007

(51) Int. Cl.
*H01L 27/92* (2006.01)
(52) U.S. Cl. .................. 257/369; 257/E27.062
(58) Field of Classification Search .................. 257/369, 257/351, 59
See application file for complete search history.

(56) References Cited

U.S. PATENT DOCUMENTS

| 7,115,954 | B2 * | 10/2006 | Shimizu et al. | 257/369 |
|---|---|---|---|---|
| 7,381,609 | B2 * | 6/2008 | Yang et al. | 438/218 |
| 7,423,330 | B2 * | 9/2008 | Satoh | 257/649 |
| 2006/0202278 | A1 * | 9/2006 | Shima et al. | 257/369 |
| 2008/0251853 | A1 * | 10/2008 | Chen et al. | 257/369 |

* cited by examiner

*Primary Examiner*—Nathan W Ha
(74) *Attorney, Agent, or Firm*—Winston Hsu

(57) ABSTRACT

A CMOS transistor device including a tensile-stressed NMOS transistor and a PMOS transistor is disclosed. The NMOS transistor includes a gate, a gate oxide layer between the gate and semiconductor substrate, a silicon oxide offset spacer on sidewalls of the gate, N type lightly doped source/drain implanted into the semiconductor substrate next to the silicon oxide offset spacer, N type heavily doped source/drain implanted into the semiconductor substrate next to the N type lightly doped source/drain, and tensile-stressed silicon nitride layer covering the gate, the N type lightly doped source/drain, and the N type heavily doped source/drain.

19 Claims, 12 Drawing Sheets

US 7,589,385 B2

SEMICONDUCTOR CMOS TRANSISTORS AND METHOD OF MANUFACTURING THE SAME

BACKGROUND OF THE INVENTION

1. Field of the Invention

The present invention generally relates to the field of semiconductor complementary metal-oxide semiconductor (hereinafter referred to as CMOS) transistor devices, and more particularly to a method of manufacturing semiconductor NMOS and PMOS transistor devices having improved saturation current (Idsat).

2. Description of the Prior Art

For decades, chip manufacturers have made transistors faster by making them smaller. FIGS. 1-5 are schematic cross-sectional diagrams illustrating a prior art method of fabricating a semiconductor CMOS transistor device. As shown in FIG. 1, an N well 12 and a P well 14 are formed in the semiconductor substrate 10. The N well 12 is isolated from P well 14 by shallow trench isolation (STI) regions 16. Polysilicon gates 18 are formed on the N well 12 and P well 14. Gate oxide layer 20 is disposed between the polysilicon gates 18 and the semiconductor substrate 10. Each polysilicon gate 18 has sidewalls 18a and a top surface 18b.

As shown in FIG. 2, offset spacers 22 are formed on the sidewalls 18a of each polysilicon gates 18. Typically, the offset spacers 22 are silicon dioxide spacers. After the formation of the offset spacers, an ion implantation process 24 and an ion implantation process 28 are carried out to form N type lightly doped drain/source 26 and P type lightly doped drain/source 30 next to the polysilicon gates 18.

As shown in FIG. 3, silicon dioxide liner 31 and silicon nitride spacers 32 are formed on the sidewalls 18a of each polysilicon gates 18. Succeedingly, an ion implantation process 34 and an ion implantation process 38 are carried out to form N type heavily doped drain/source 36 and P type heavily doped drain/source 40 in the semiconductor substrate 10.

As shown in FIG. 4, a salicide process is carried out to form silicide layer 46 on the top surface 18b of each polysilicon gate 18, and also on the N type heavily doped drain/source 36 and P type heavily doped drain/source 40. Thereafter, a silicon nitride layer 50 having a thickness of about 300-600 angstroms is deposited over the semiconductor substrate 10. The silicon nitride layer 50 acts as a contact etch stop layer (CESL) during the etching of contact holes.

Subsequently, as shown in FIG. 5, a dielectric layer 54 is deposited on the silicon nitride layer 50. Using conventional lithographic and etching processes, contact holes are etched into the dielectric layer 54 and the silicon nitride layer 50 to expose a portion of the N type heavily doped drain/source 36 and P type heavily doped drain/source 40. Finally, the contact holes are filled with conductive plug material 60 such as tungsten. In operation, a voltage applied to the gate creates an electric field in the underlying gate channel. Depending on the polarity of the applied voltage, that field turns on or off the electric current between the transistor's source and drain.

However, the chip manufacturers have reached the point at which transistors are so small that the ability to keep shrinking them is now facing some challenges. For example, mainly because of current leakage (off-current) problem, manufacturers can no longer thin down available gate oxides as much as they used to.

SUMMARY OF THE INVENTION

It is the primary object of the present invention to provide a semiconductor CMOS transistor device having improved performance.

It is another object of the present invention to provide a method of manufacturing a semiconductor CMOS transistor device having improved performance.

According to the claimed invention, a CMOS transistor device is disclosed. The CMOS transistor device includes an NMOS transistor and a PMOS transistor. The NMOS transistor includes a first gate, a first gate oxide layer between the first gate and the semiconductor substrate, silicon oxide offset spacer on sidewalls of the first gate, N type lightly doped source/drain implanted into the semiconductor substrate next to the silicon oxide offset spacer, N type heavily doped source/drain implanted into the semiconductor substrate next to the N type lightly doped source/drain, and tensile-stressed silicon nitride layer covering the first gate, the N type lightly doped source/drain, and the N type heavily doped source/drain. The PMOS transistor includes a second gate, a second gate oxide layer between the second gate and the semiconductor substrate, silicon nitride spacer on sidewalls of the second gate, P type lightly doped source/drain implanted into the semiconductor substrate under the silicon nitride spacer, P type heavily doped source/drain implanted into the semiconductor substrate next to the P type lightly doped source/drain, and compressive-stressed silicon nitride layer covering the second gate, the silicon nitride spacer, and the N type heavily doped source/drain, wherein the tensile-stressed silicon nitride layer is disposed atop the compressive-stressed silicon nitride layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to an integrated CMOS process that involves the use of crystal strain technology. Crystal strain technology is becoming more and more attractive as a means for getting better performance in the field of CMOS transistor fabrication. Putting a strain on a semiconductor crystal alters the speed at which charges move through that crystal. Strain makes CMOS transistors work better by enabling electrical charges, such as electrons, to pass more easily through the silicon lattice of the gate channel.

Strain influences each type of electrical charges in CMOS transistors differently. Tensile strain, in which the interatomic distances in the silicon crystal are stretched, typically increases the mobility of electrons, making N-type transistors faster. But tensile strain may not benefit P-type devices as much, and it may even slow them down. Compressive strain, in which those interatomic distances are shortened, produces essentially the opposite effects.

Figure 1:
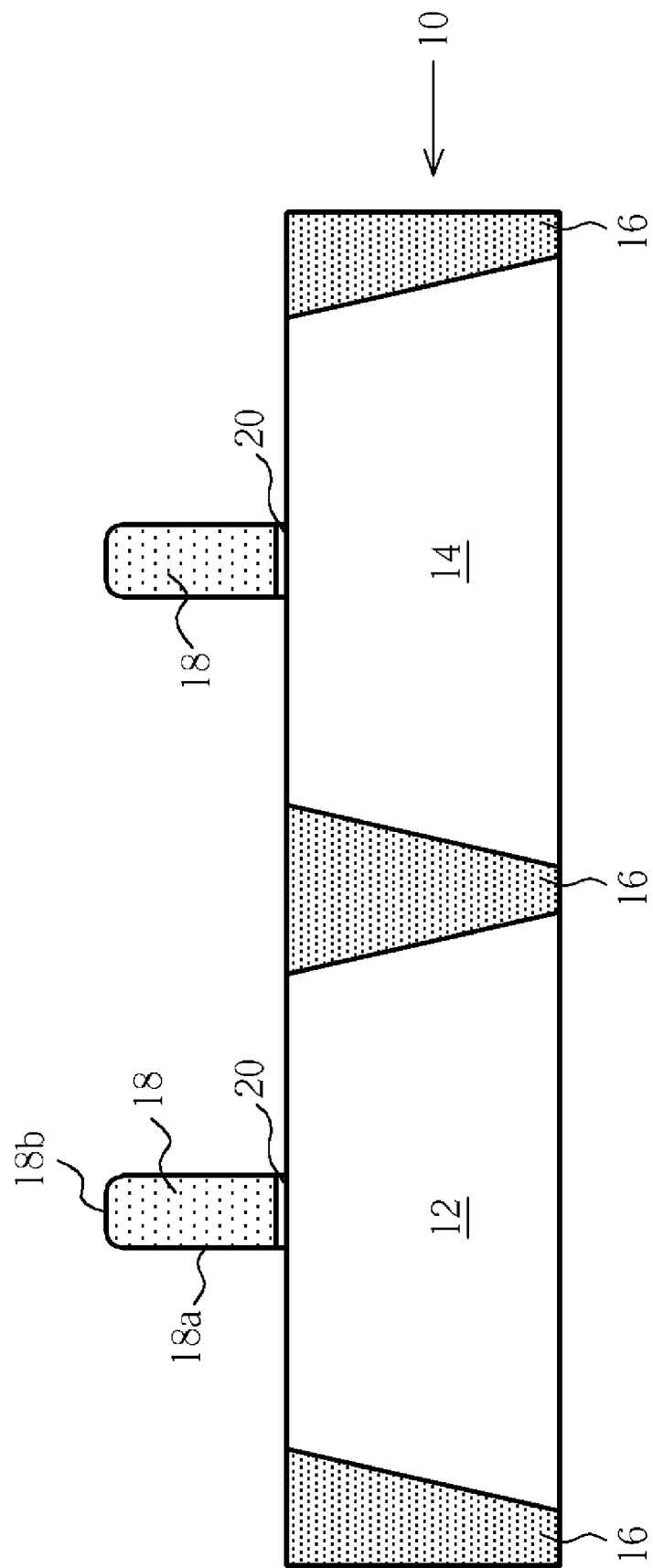
FIGS. 1-5 are schematic cross-sectional diagrams illustrating a prior art method of fabricating a semiconductor CMOS transistor device.
Figure 2:
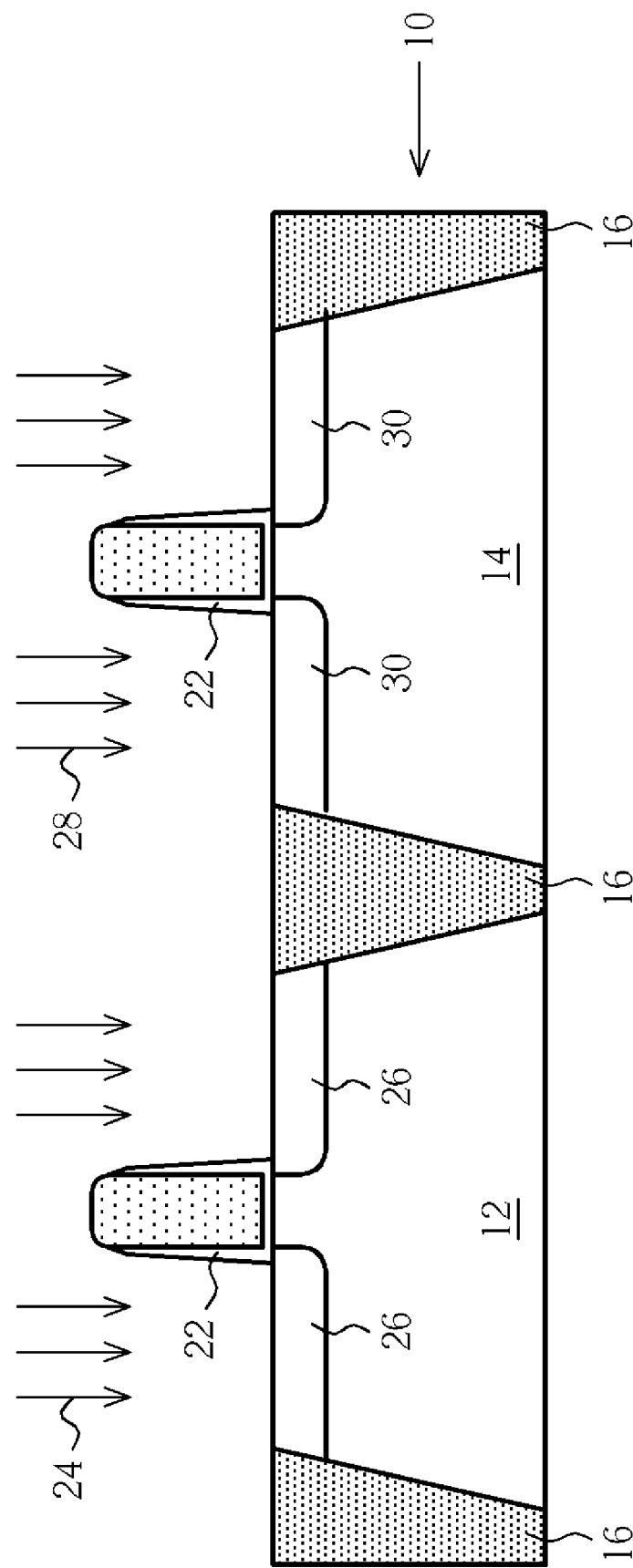
Figure 3:
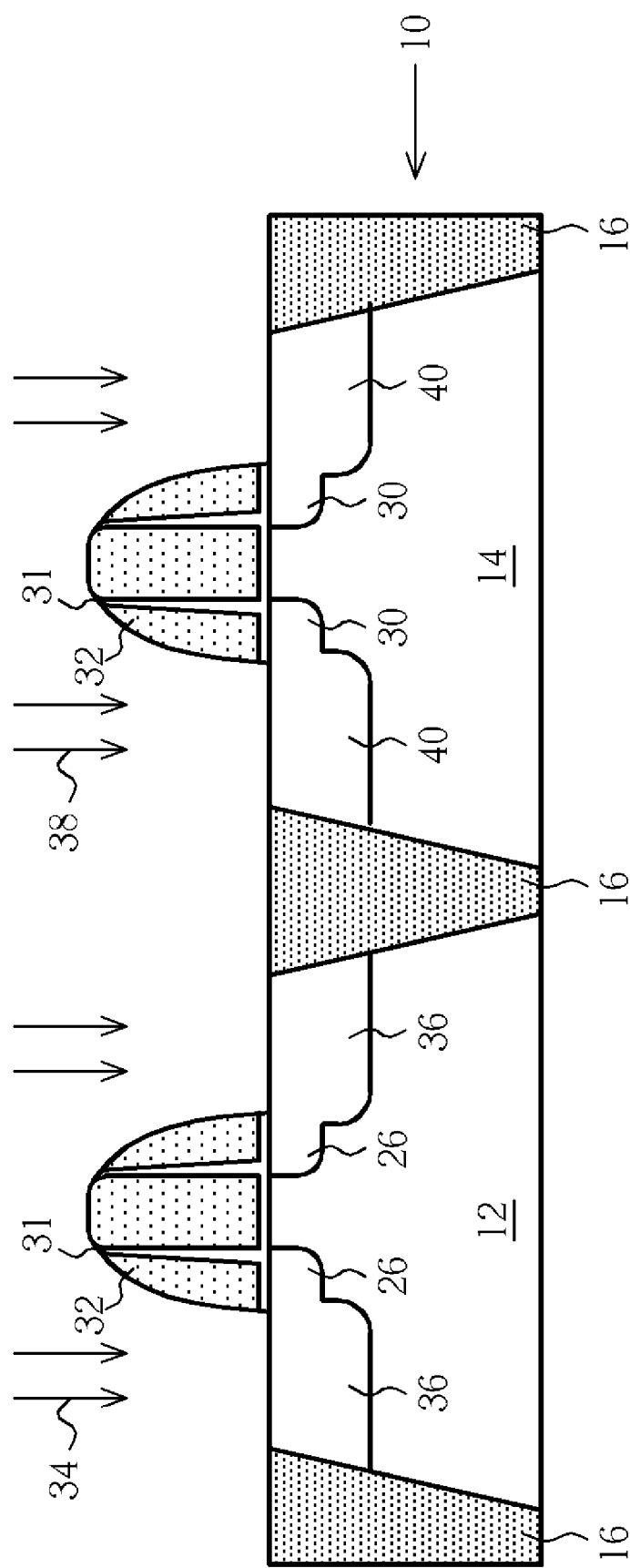
Figure 4:
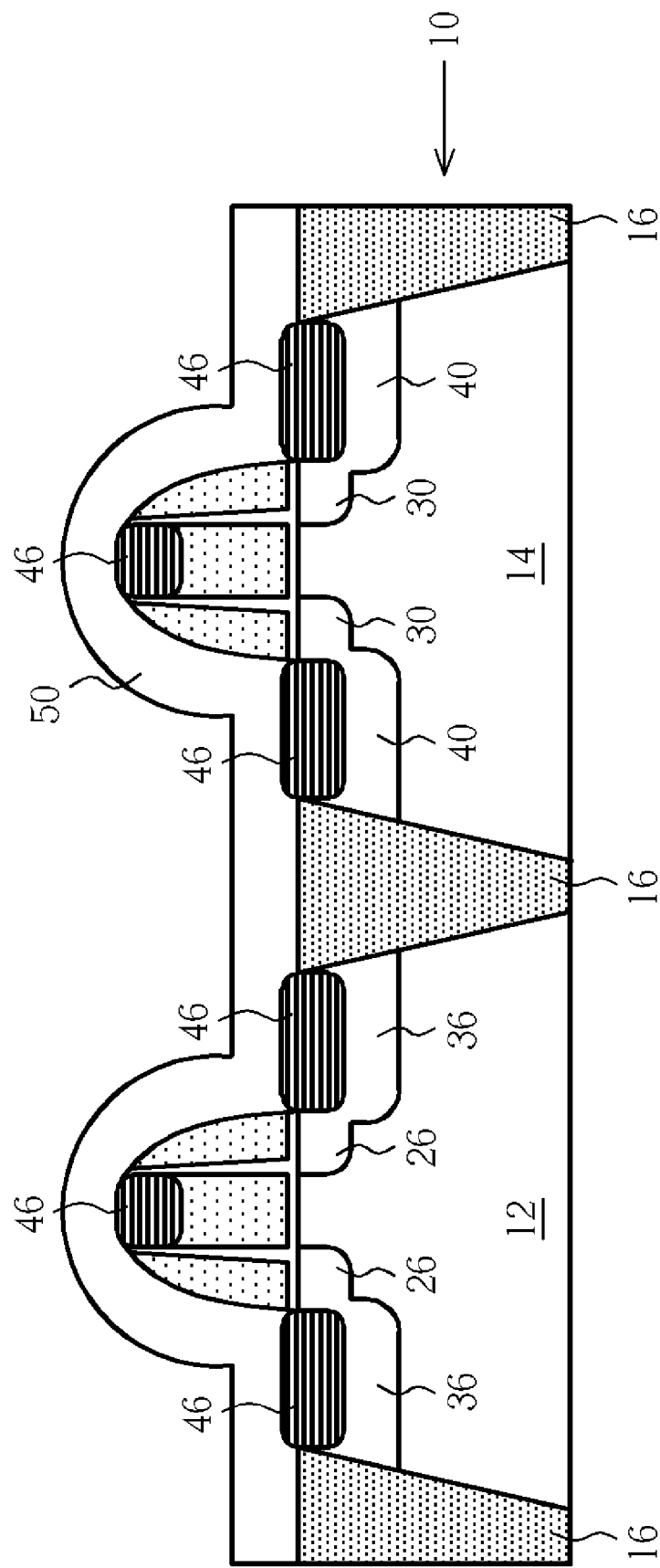
Figure 5:
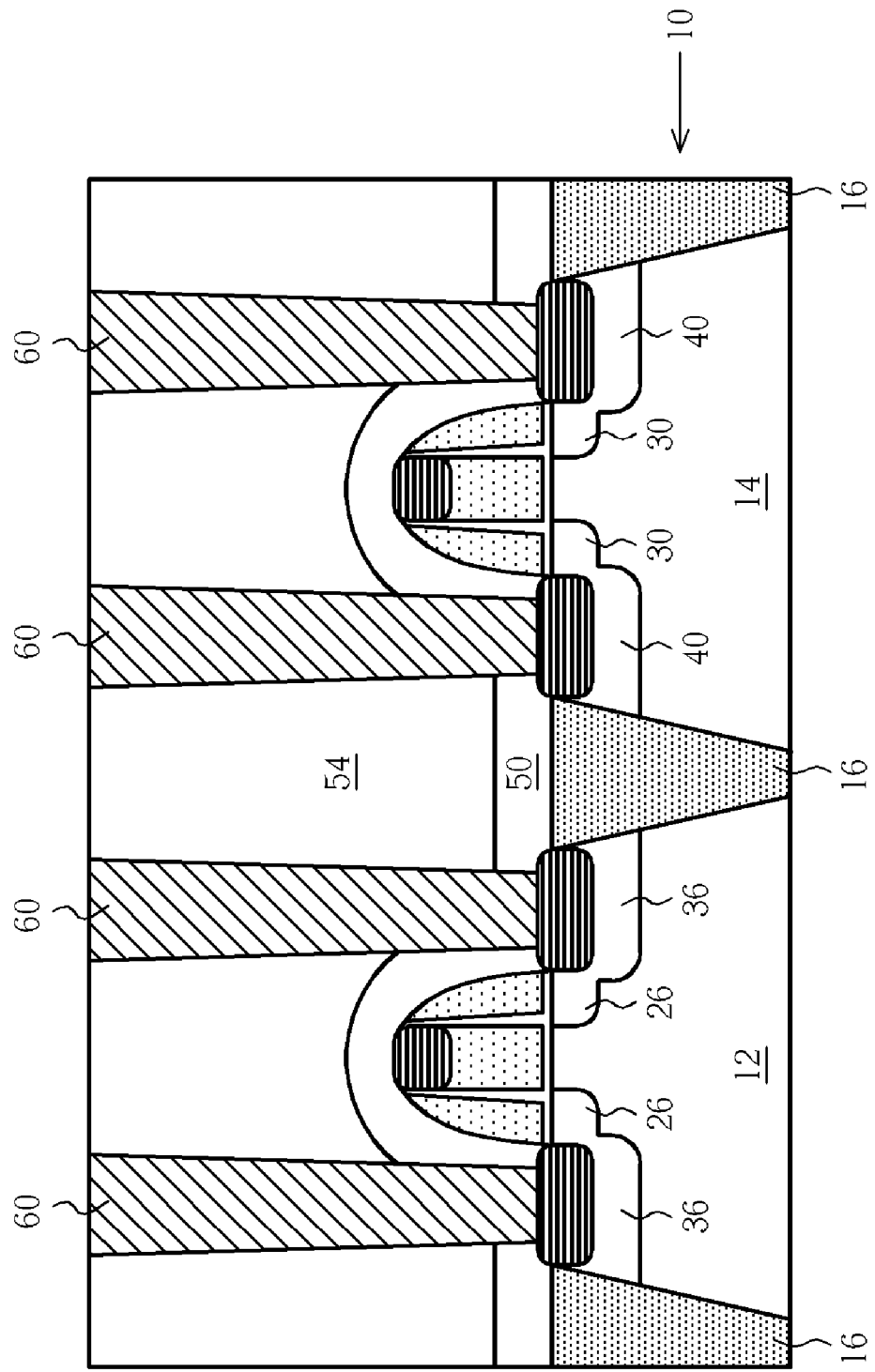
Figure 6:
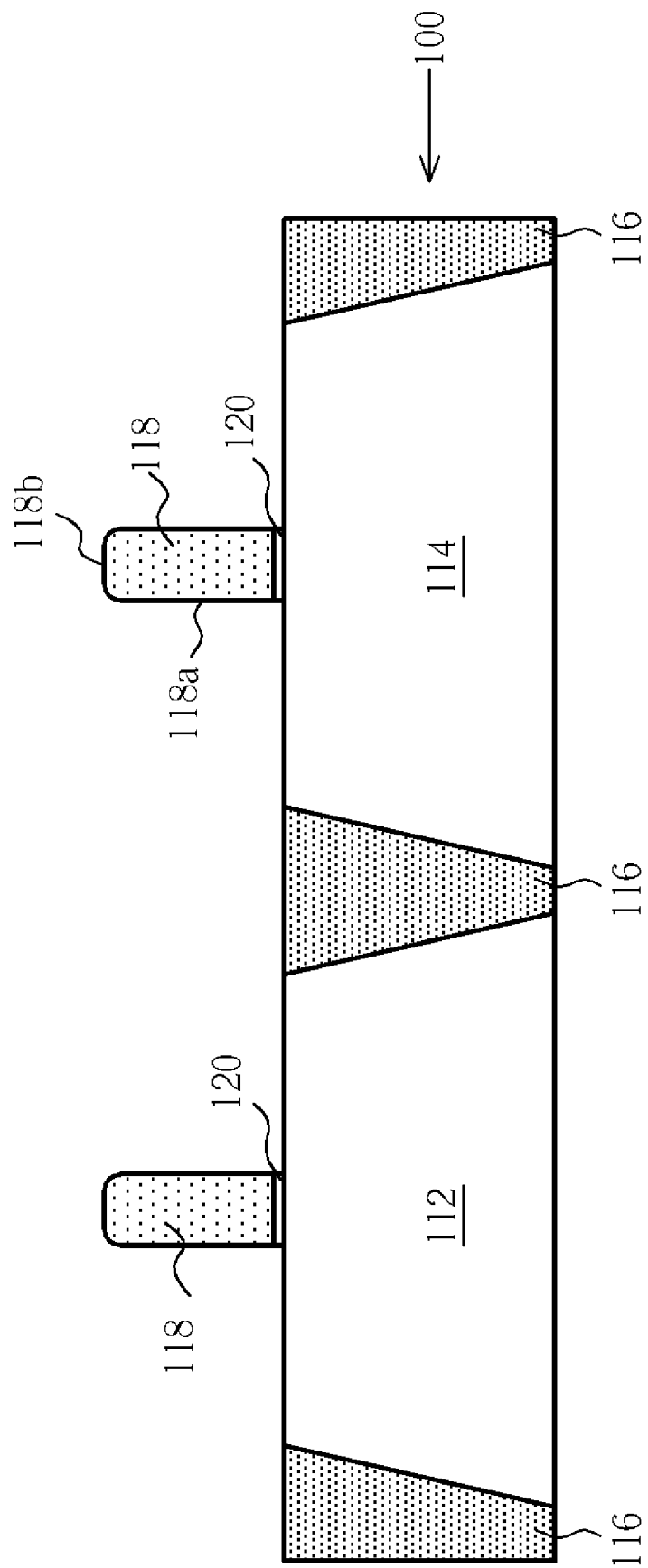
FIGS. 6-12 are schematic cross-sectional diagrams illustrating a method of fabricating semiconductor CMOS transistor device in accordance with one preferred embodiment of the present invention.

FIGS. 6-12 are schematic cross-sectional diagrams illustrating a method of fabricating semiconductor CMOS transistor device in accordance with one preferred embodiment of the present invention. As shown in FIG. 6, an N well 112 and a P well 114 are formed in the semiconductor substrate 100. The N well 112 is isolated from P well 114 by shallow trench isolation (STI) regions 116. The semiconductor substrate 100 may be a silicon substrate, silicon-on-insulator (SOI) substrate or any suitable semiconductor substrate with epitaxial layers. Such epitaxial layers include, but not limited to, silicon epitaxial layer, silicon germanium epitaxial (SiGe) layer or the like.

Polysilicon gates 118 are formed on the N well 112 and P well 114 using methods known in the art. Gate oxide layer 120 is disposed between the polysilicon gates 118 and the semiconductor substrate 100. Each polysilicon gate 118 has sidewalls 118a and a top surface 118b.

Figure 7:
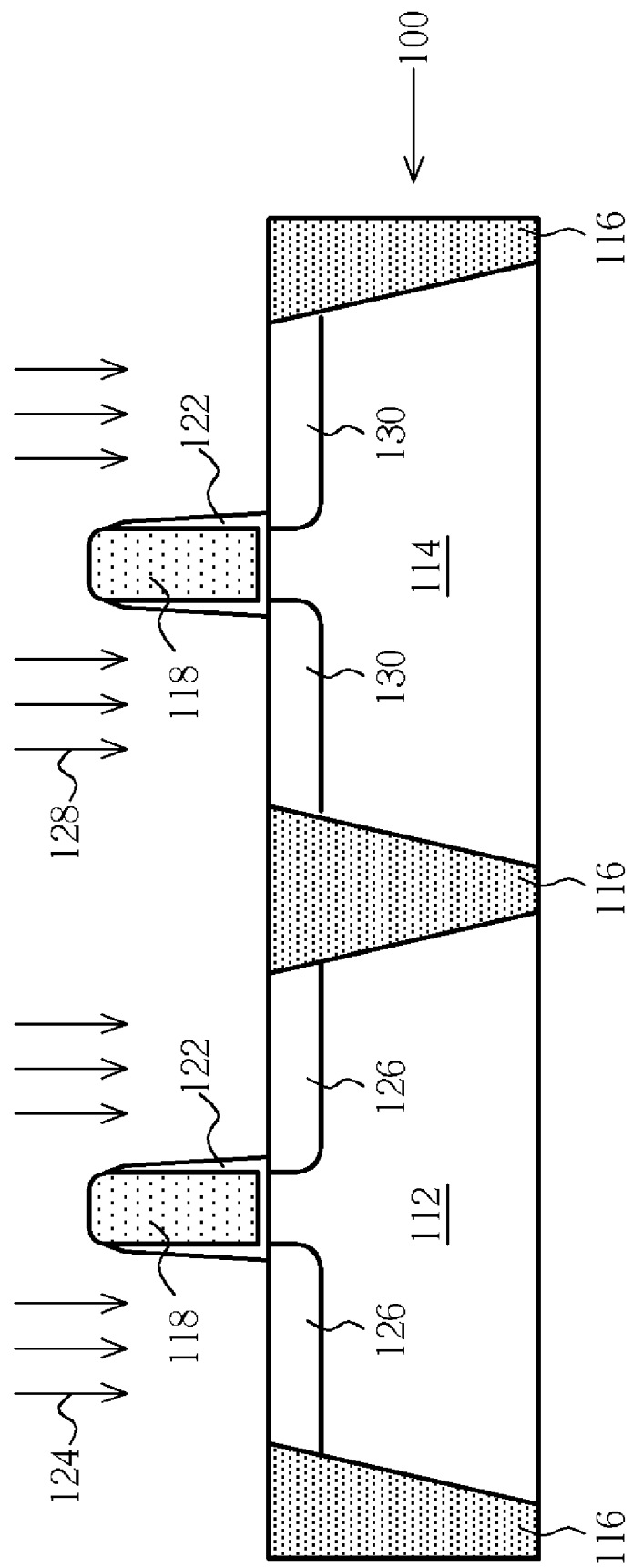

As shown in FIG. 7, offset spacers 122 having a thickness of about 20-150 angstroms are formed on the sidewalls 118a of each polysilicon gates 118. Typically, the offset spacers 122 are silicon dioxide spacers. After the formation of the offset spacers, an ion implantation process 124 and an ion implantation process 128 are carried out to form N type lightly doped drain/source 126 and P type lightly doped drain/source 130 next to the polysilicon gates 118.

Figure 8:
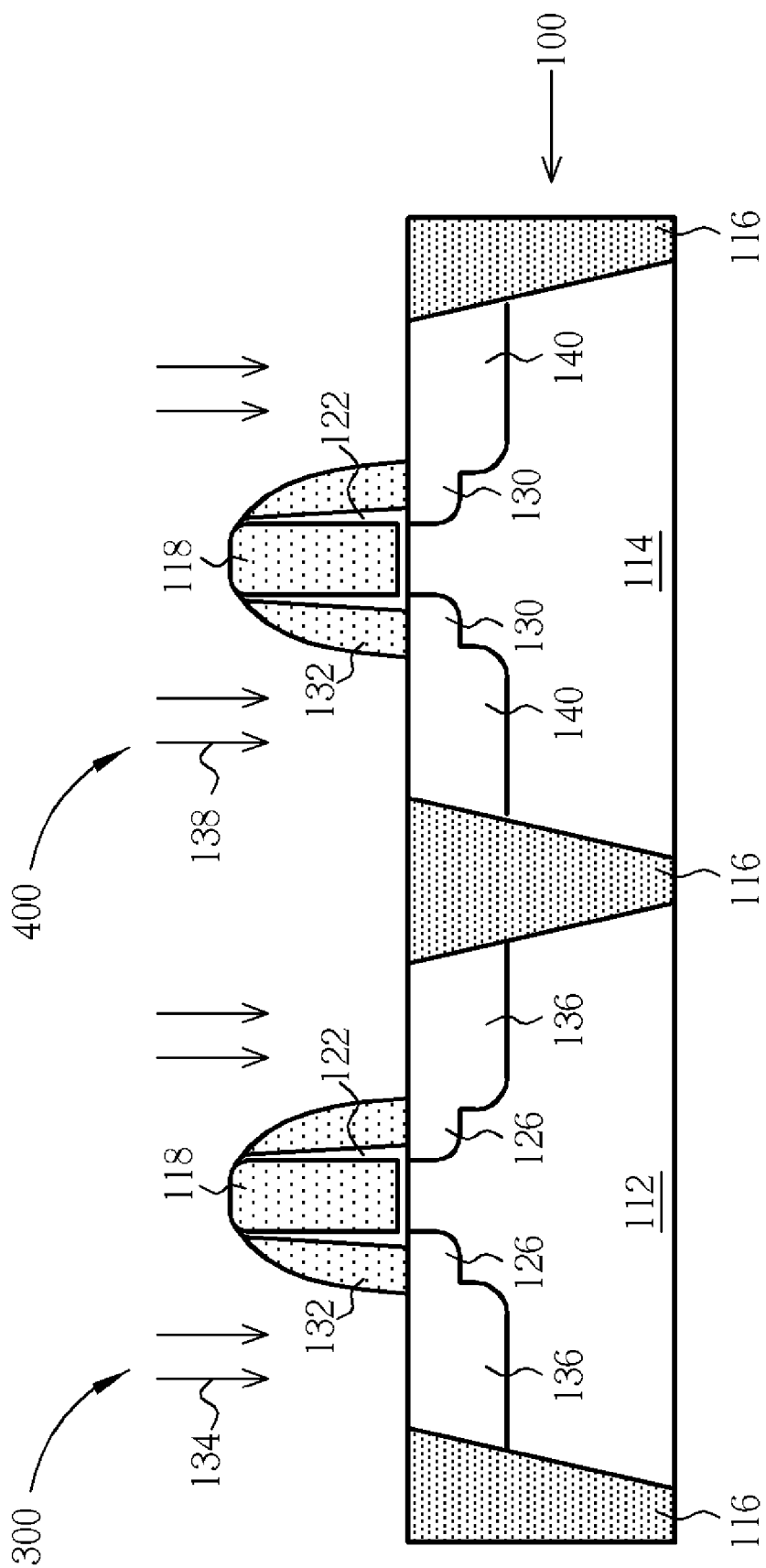

As shown in FIG. 8, silicon nitride spacers 132 are formed on the sidewalls 118a of each polysilicon gates 118. Succeedingly, an ion implantation process 134 and an ion implantation process 138 are carried out to form N type heavily doped drain/source 136 and P type heavily doped drain/source 140 in the semiconductor substrate 100, thereby forming an NMOS transistor 300 and a PMOS transistor 400.

Figure 9:
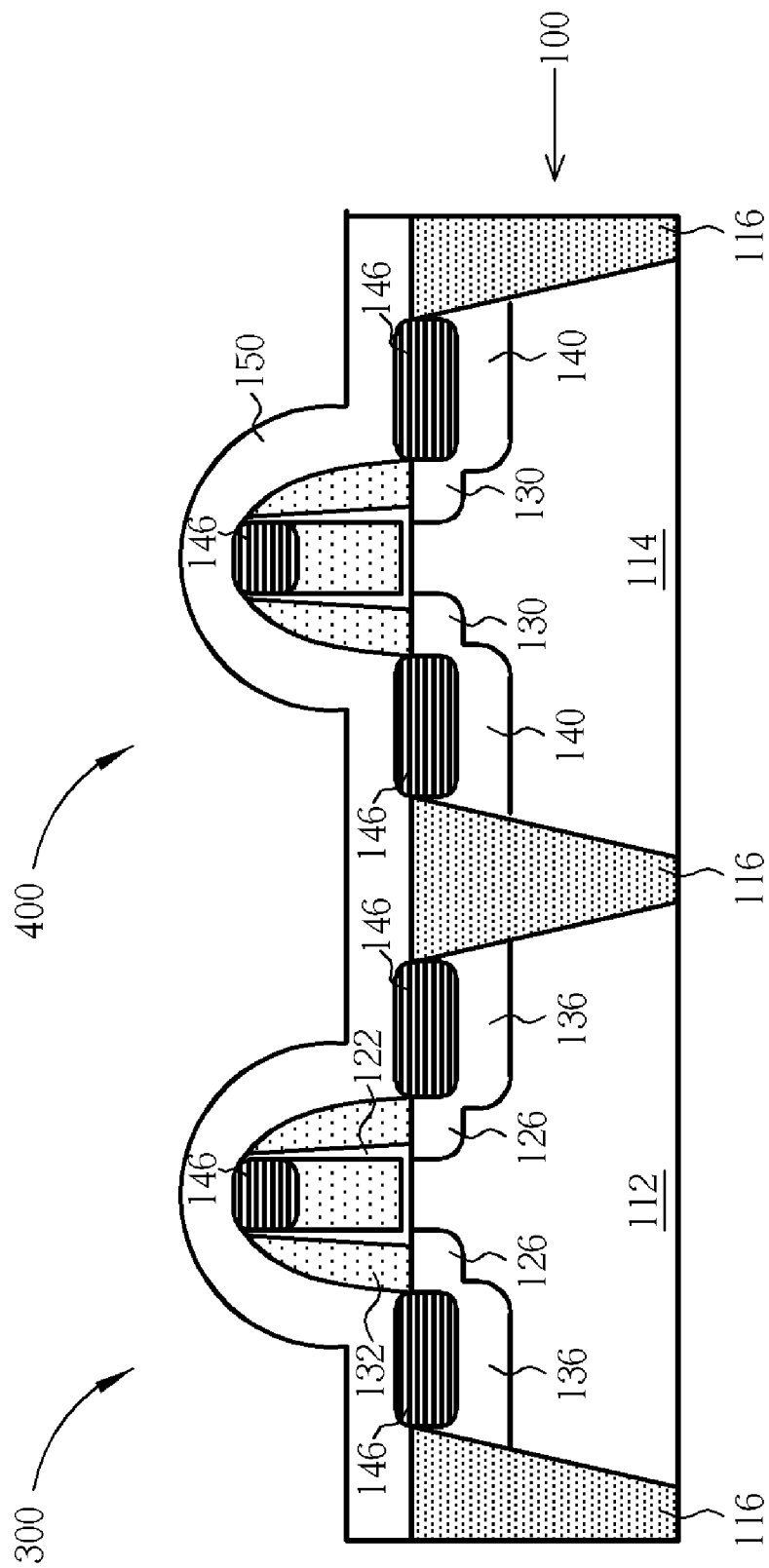

As shown in FIG. 9, a salicide process is carried out to form a silicide layer 146 on the top surface 118b of each polysilicon gate 118, and also on the N type heavily doped drain/source 136 and P type heavily doped drain/source 140. Such salicide process is known in the art. Typically, a salicide process includes depositing a metal layer on the gate and source/drain regions, thermally reacting the metal layer with the underlying silicon or polysilicon in contact with the metal layer, and removing the un-reacted metal layer.

Thereafter, a silicon nitride layer 150 having a thickness of about 300-2000 angstroms, preferably 900-1100 angstroms, is deposited over the semiconductor substrate 100. According to the preferred embodiment of the present invention, the silicon nitride layer 150 is a highly compressive-stressed silicon nitride layer having a compressive stress that is larger than 1 Gpa, for example, 1.3 Gpa. To form such highly compressive-stressed silicon nitride layer, a plasma-enhanced chemical vapor deposition (PECVD) can be employed.

Figure 10:
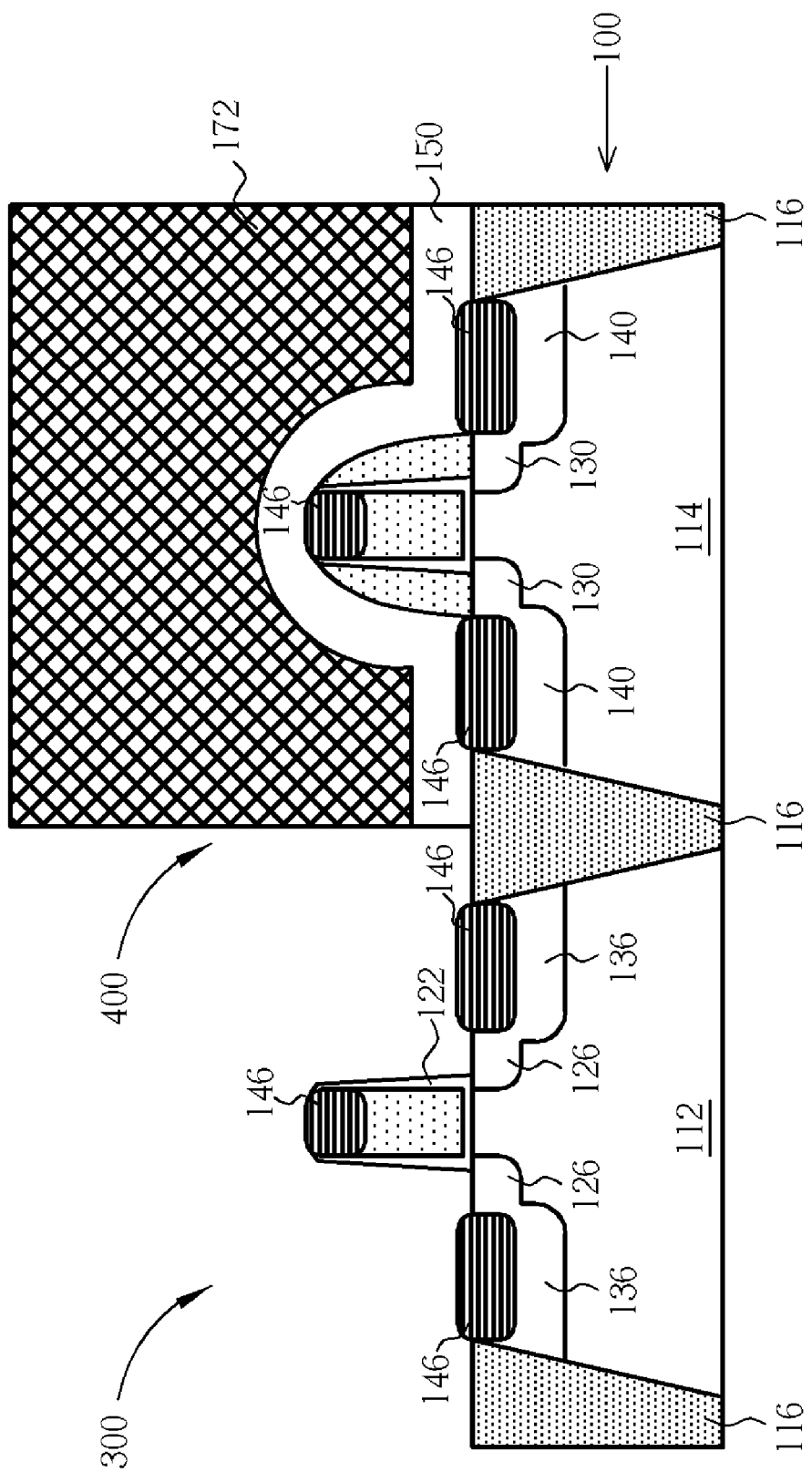

As shown in FIG. 10, a photo resist layer 172 is used to mask the PMOS transistor 400. The NMOS transistor 300 and the silicon nitride layer 150 over the NMOS transistor 300 are not covered by the photo resist layer 172. The un-masked silicon nitride layer 150 over the NMOS transistor 300 is then removed by etching such as dry etching or wet etching. The silicon nitride spacers 132 on sidewalls of the polysilicon gate 118 of the NMOS transistor 300 are also removed. After removing the silicon nitride spacers 132 of the NMOS transistor 300, the photo resist layer 172 is stripped.

Figure 11:
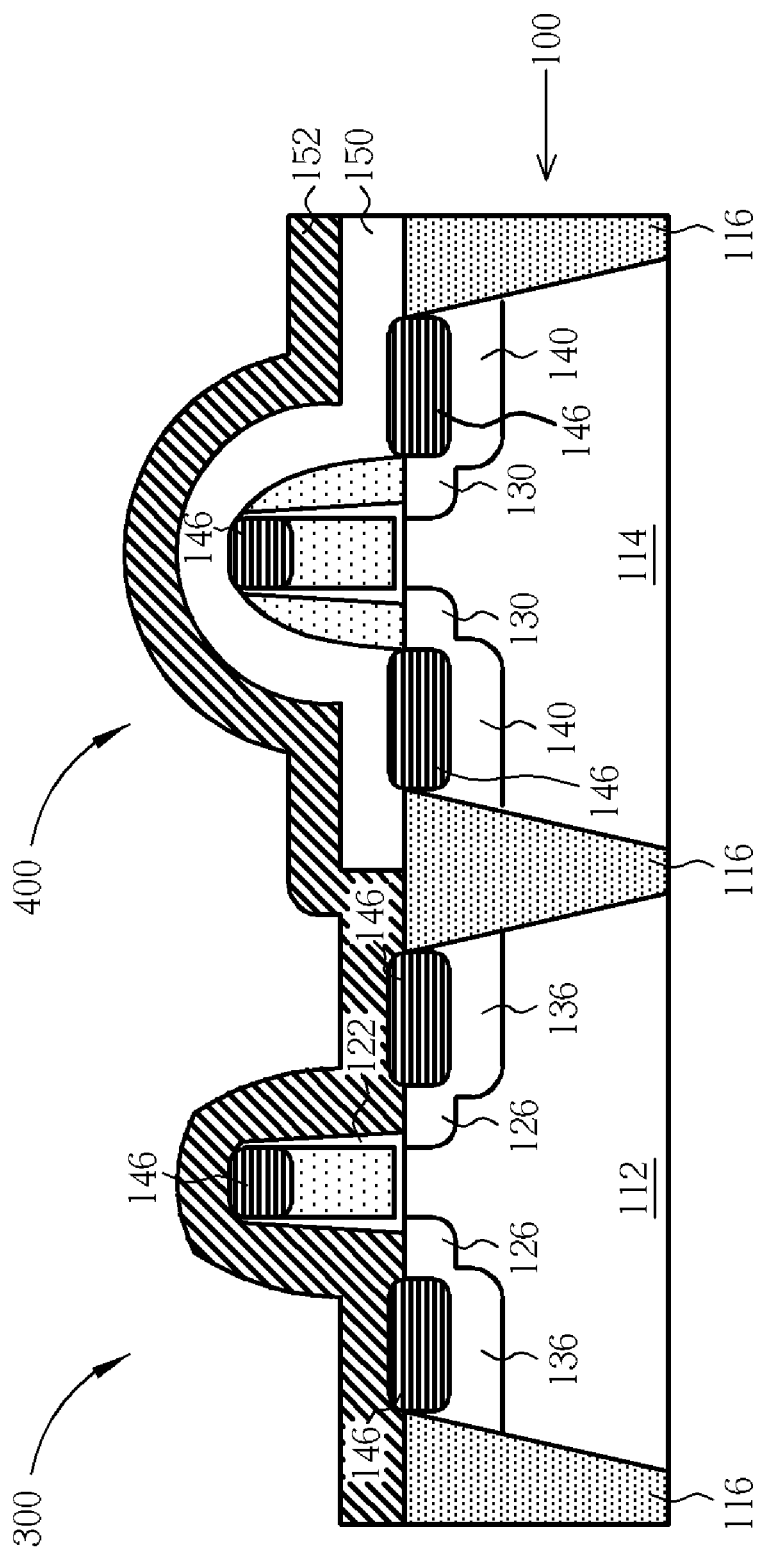

Subsequently, as shown in FIG. 11, a silicon nitride layer 152 having a thickness of about 300-2000 angstroms, preferably 900-1100 angstroms, is deposited over the semiconductor substrate 100. According to the preferred embodiment of the present invention, the silicon nitride layer 152 is a highly tensile-stressed silicon nitride layer having a tensile stress that is larger than 1 Gpa, for example, 1.3 Gpa. To form such highly tensile-stressed silicon nitride layer, a PECVD can be employed. It is worthy noted that the tensile-stressed silicon nitride layer 152 is directly deposited on the N type lightly doped drain/source 126 of the NMOS transistor 300 and covers the compressive-stressed silicon nitride layer 150 disposed above the PMOS transistor 400.

The tensile-stressed silicon nitride layer 152 strains the crystal in the gate channel of the NMOS transistor 300, thereby increasing the mobility of electrons, and making NMOS transistor 300 faster. On the other hand, the tensile-stressed silicon nitride layer 152 does not adversely affect the PMOS transistor 400 since the interaction between the compressive-stressed silicon nitride layer 150 and the tensile-stressed silicon nitride layer 152.

According to another preferred embodiment of this invention, the transistor 300 as depicted in FIG. 11 is a PMOS transistor, the silicon nitride layer 152 is compressive stressed, while the transistor 400 as depicted in FIG. 11 is an NMOS transistor, and the silicon nitride layer 150 is tensile stressed. In this case, the compressive stressed silicon nitride layer can improve the performance of the PMOS transistor.

Figure 12:
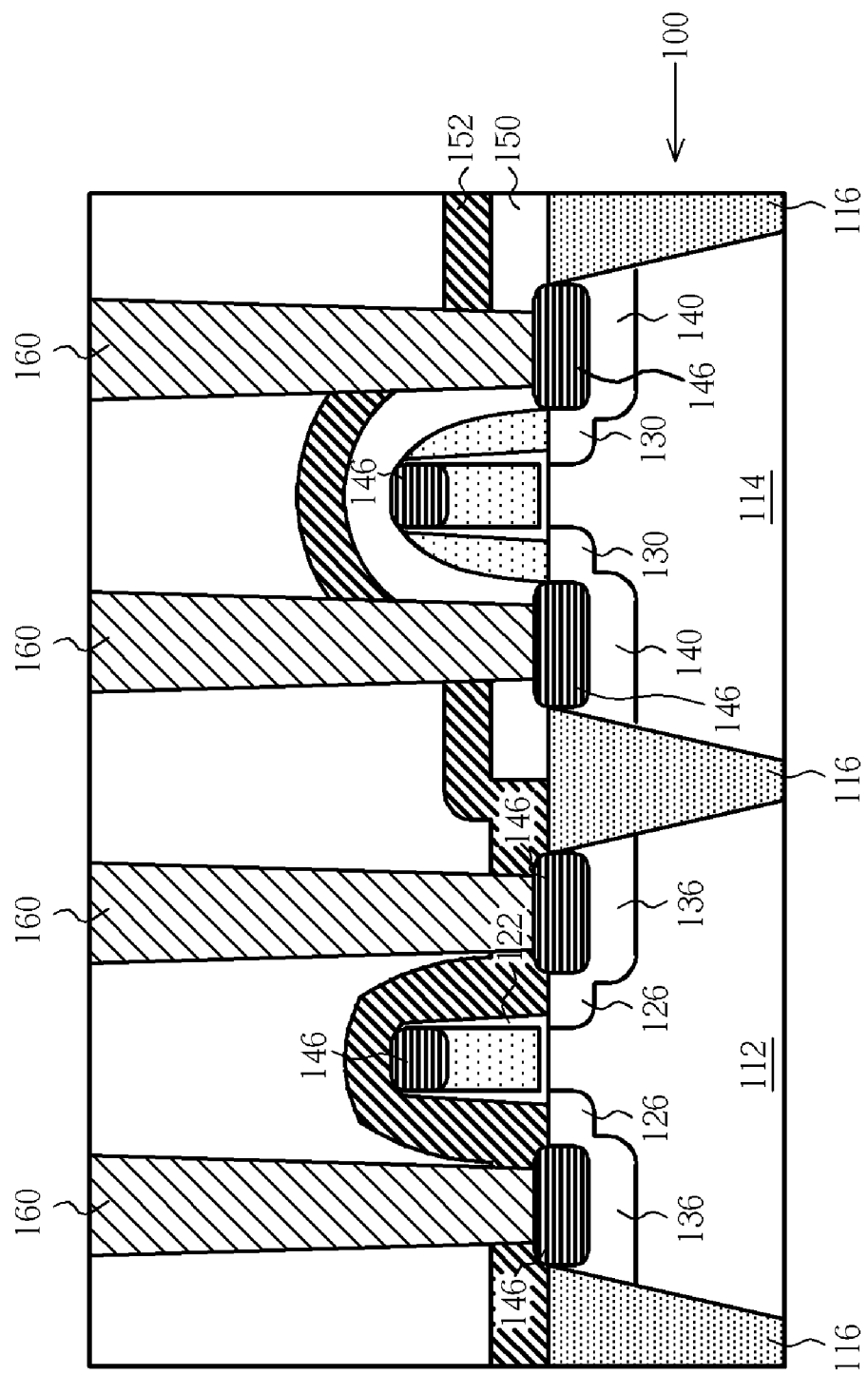

As shown in FIG. 12, a dielectric layer 154 such as BSG, BPSG, undoped silicon glass (USG), or low-k dielectrics is deposited on the silicon nitride layer 150. Using conventional lithographic and etching processes, contact holes are etched into the dielectric layer 154 and the silicon nitride layers 150 and 152 to expose a portion of the N type heavily doped drain/source 136 and P type heavily doped drain/source 140. Finally, the contact holes are filled with conductive plug material 160 such as tungsten.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A complementary metal-oxide semiconductor (CMOS) transistor device, comprising:
   a semiconductor substrate;
   an NMOS transistor having a first gate, a first gate oxide layer between the first gate and the semiconductor substrate, silicon oxide offset spacer on sidewalls of the first gate, N type lightly doped source/drain implanted into the semiconductor substrate next to the silicon oxide offset spacer, N type heavily doped source/drain implanted into the semiconductor substrate next to the N type lightly doped source/drain, and tensile-stressed silicon nitride layer covering the first gate, the N type lightly doped source/drain, and the N type heavily doped source/drain, wherein the tensile-stressed silicon nitride layer directly contacts the N type lightly doped source/drain; and
   a PMOS transistor having a second gate, a second gate oxide layer between the second gate and the semiconductor substrate, silicon nitride spacer on sidewalls of the second gate, P type lightly doped source/drain implanted into the semiconductor substrate under the silicon nitride spacer, P type heavily doped source/drain implanted into the semiconductor substrate next to the P type lightly doped source/drain, and compressive-stressed silicon nitride layer covering the second gate, the silicon nitride spacer, and the N type heavily doped source/drain.

2. The CMOS transistor device according to claim 1 wherein the tensile-stressed silicon nitride layer is disposed atop the compressive-stressed silicon nitride layer.

3. The CMOS transistor device according to claim 1 wherein the tensile-stressed silicon nitride layer has a tensile stress that is larger than 1 Gpa.

4. The CMOS transistor device according to claim 1 wherein the compressive-stressed silicon nitride layer has a compressive stress that is larger than 1 Gpa.

5. The CMOS transistor device according to claim 1 wherein tensile-stressed silicon nitride layer has a thickness of about 900-1100 angstroms.

6. The CMOS transistor device according to claim 1 wherein the compressive-stressed silicon nitride layer has a thickness of about 900-1100 angstroms.

7. The CMOS transistor device according to claim 1 further comprising a silicide layer formed on the N type heavily doped source/drain and on the P type heavily doped source/drain.

8. The CMOS transistor device according to claim 1 wherein the compressive-stressed silicon nitride layer does not contact with the P type lightly doped source/drain.

9. A complementary metal-oxide semiconductor (CMOS) transistor device, comprising:
a semiconductor substrate;
a first transistor having a first gate, a first gate oxide layer between the first gate and the semiconductor substrate, offset spacer on sidewalls of the first gate, first lightly doped source/drain implanted into the semiconductor substrate next to the offset spacer, first heavily doped source/drain implanted into the semiconductor substrate next to the first lightly doped source/drain, and first etching stop layer having first stress status covering the first gate, the first lightly doped source/drain, and the first heavily doped source/drain, wherein the first etching stop layer directly contacts the first lightly doped source/drain; and
a second transistor having a second gate, a second gate oxide layer between the second gate and the semiconductor substrate, silicon nitride spacer on sidewalls of the second gate, second lightly doped source/drain implanted into the semiconductor substrate under the silicon nitride spacer, second heavily doped source/drain implanted into the semiconductor substrate next to the second lightly doped source/drain, and second etching stop layer having second stress status opposite to the first stress status, the second etching stop layer covering the second gate, the silicon nitride spacer, and the second heavily doped source/drain.

10. The CMOS transistor device according to claim 9 wherein the first etching stop layer is disposed atop the second etching stop layer.

11. The CMOS transistor device according to claim 9 wherein the first transistor is an NMOS transistor and the second transistor is a PMOS transistor.

12. The CMOS transistor device according to claim 9 wherein the first etching stop layer comprises silicon nitride, and the first stress status is tensile stress.

13. The CMOS transistor device according to claim 9 wherein the second etching stop layer comprises silicon nitride, and the second stress status is compressive stress.

14. The CMOS transistor device according to claim 9 wherein the first etching stop layer has a thickness of about 900-1100 angstroms.

15. The CMOS transistor device according to claim 9 wherein the second etching stop layer has a thickness of about 900-1100 angstroms.

16. The CMOS transistor device according to claim 9 wherein the offset spacer is made of silicon oxide.

17. The CMOS transistor device according to claim 9 wherein the first transistor is a PMOS transistor and the second transistor is an NMOS transistor.

18. The CMOS transistor device according to claim 9 wherein the first etching stop layer comprises silicon nitride, and the first stress status is compressive stress.

19. The CMOS transistor device according to claim 9 wherein the second etching stop layer comprises silicon nitride, and the second stress status is tensile stress.

* * * * *